United States Patent
Bonebright et al.

(10) Patent No.: US 10,290,939 B2
(45) Date of Patent: May 14, 2019

(54) HEAT REGULATION FOR COMPONENTS OF PHASED ARRAY ANTENNAS

(71) Applicant: The Boeing Company, Chicago, IL (US)

(72) Inventors: Rodney K. Bonebright, Bellevue, WA (US); Mark William Steeds, Auburn, WA (US); Gary Wilsey, Renton, WA (US); Jacob C. Killens, Auburn, WA (US)

(73) Assignee: THE BOEING COMPANY, Chicago, IL (US)

( * ) Notice: Subject to any disclaimer, the term of this patent is extended or adjusted under 35 U.S.C. 154(b) by 746 days.

(21) Appl. No.: 14/808,655

(22) Filed: Jul. 24, 2015

(65) Prior Publication Data
US 2018/0076518 A1    Mar. 15, 2018

(51) Int. Cl.
*H01Q 3/26* (2006.01)
*H01Q 3/36* (2006.01)
*H01Q 3/38* (2006.01)
*H03F 1/30* (2006.01)
*H03F 3/19* (2006.01)
*H01Q 1/02* (2006.01)
*H01Q 21/22* (2006.01)

(52) U.S. Cl.
CPC ............ *H01Q 3/267* (2013.01); *H01Q 1/02* (2013.01); *H01Q 3/36* (2013.01); *H01Q 3/38* (2013.01); *H01Q 21/22* (2013.01); *H03F 1/30* (2013.01); *H03F 3/19* (2013.01); *H03F 2200/451* (2013.01); *H03F 2200/468* (2013.01)

(58) Field of Classification Search
CPC ............ H01Q 3/26; H01Q 3/36; H01Q 3/267; H01Q 1/02; H01Q 21/22
USPC ......... 342/368, 372, 374; 330/279, 289, 295
See application file for complete search history.

(56) References Cited

U.S. PATENT DOCUMENTS

| | | |
|---|---|---|
| 5,093,667 A | 3/1992 | Andricos |
| 2008/0278236 A1 | 11/2008 | Seymour |
| 2010/0273431 A1 | 10/2010 | Fraser et al. |
| 2011/0280288 A1 | 11/2011 | Buer et al. |
| 2014/0354350 A1 | 12/2014 | Bowers et al. |
| 2015/0372649 A1 | 12/2015 | Garrec et al. |

FOREIGN PATENT DOCUMENTS

WO    2014131849 A1    9/2014

OTHER PUBLICATIONS

Pfeiffer et al., A 20 dBm Fully-Integrated 60 GHz SiGe Power Amplifer With Automatic Level Control, IEEE Journal of Solid-State Circuits, vol. 42, No. 7, Jul. 2007.
European Search Report; dated Dec. 20, 2016; Applicant; The Boeing Company; Application No. 16180478.6.

*Primary Examiner* — Dao L Phan
(74) *Attorney, Agent, or Firm* — Duft & Bornsen, PC

(57) ABSTRACT

Systems and methods are provided for regulating heat for a Phased Array Antenna (PAA). The system includes a PAA, which includes array elements to handle Radio Frequency (RF) signals. The PAA also includes a circuit. The circuit includes an amplifier that operates on a current to amplify signals for the PAA, and a sensor that measures temperature at the MMIC. The PAA also includes an array controller that adjusts the current for the amplifier based on a temperature measured by the sensor.

20 Claims, 7 Drawing Sheets

HEAT REGULATION FOR COMPONENTS OF PHASED ARRAY ANTENNAS

FIELD

The disclosure relates to the field of antennas.

BACKGROUND

Phased Array Antennas (PAAs) are antennas that utilize a group of array elements (e.g., small antennas), instead of a single large dish, in order to receive or transmit Radio Frequency (RF) signals. A PAA is capable of operating its numerous individual array elements together in a coherent manner such that they function as a single large directional antenna. Depending on the alignment of the PAA, the distance from each array element to a target location or device (e.g., a satellite that is transmitting or receiving RF signals) may be different. If the distance between individual array elements and the target happens to vary, then the PAA shifts the phase of signals for the individual array elements in order to compensate for the different distances. By altering the phase of signals received at (or transmitted from) each of the array elements, the signals are combined for handling as one coherent beam.

While PAAs are beneficial, they often encounter problems related to overheating, particularly when they are operated in extreme temperature environments, such as deserts. For example, the array elements of a PAA may be closely packed together, resulting in little room for heat dissipation. This is problematic because the operational lifetime of an amplifier is often a non-linear function of temperature, hence the operational lifetime shortens notably when the amplifier is operated at a higher temperature. This problem is compounded in environments where increased weight and bulk are undesirable, such as within an aircraft.

SUMMARY

Embodiments described herein dynamically adjust a current applied to one or more amplifiers of a PAA based on temperature in order to ensure that the amplifiers are not damaged, nor is their operational lifetime reduced, by overheating. This beneficially protects the array elements of the PAA from encountering thermal damage, without substantially degrading the PAA gain.

One embodiment includes a Phased Array Antenna (PAA), which includes array elements to handle Radio Frequency (RF) signals. The PAA also includes a circuit (e.g., a Monolithic Microwave Integrated Circuit (MMIC)). The circuit includes an amplifier that consumes (e.g., is powered by or operates on) current to amplify signals for the PAA, and a sensor that measures temperatures at the circuit. The PAA also includes an array controller that adjusts the current for the amplifier based on a temperature measured by the sensor, thereby adjusting an amount of heat generated by the amplifier.

A further embodiment is a method. The method includes measuring a temperature at a circuit of a Phased Array Antenna (PAA). The circuit includes an amplifier that consumes current to amplify Radio Frequency (RF) signals for the PAA. The method also includes determining an adjustment to the current for the amplifier, based on the temperature, and adjusting a current for the amplifier of the circuit based on the temperature measured at the circuit.

A further embodiment includes a non-transitory computer readable medium embodying programmed instructions which, when executed by a processor, are operable for performing a method. The method includes measuring a temperature at a circuit of a Phased Array Antenna (PAA). The circuit includes an amplifier that consumes current to amplify Radio Frequency (RF) signals for the PAA. The method also includes determining an adjustment to the current for the amplifier, based on the temperature, and adjusting a current for the amplifier of the circuit based on the temperature measured at the circuit.

A further embodiment includes a Monolithic Microwave Integrated Circuit (MMIC) for a Phased Array Antenna (PAA). The MMIC includes an amplifier that operates on a current to amplify Radio Frequency (RF) signals for an array element of the PAA, and a sensor that measures temperature proximate to the amplifier. The MMIC also includes a programmable Digital to Analog Converter (DAC) that adjusts an amount of current for the amplifier in response to input, wherein the input is based on a temperature measured by the sensor.

Other exemplary embodiments (e.g., methods and computer-readable media relating to the foregoing embodiments) may be described below. The features, functions, and advantages that have been discussed can be achieved independently in various embodiments or may be combined in yet other embodiments further details of which can be seen with reference to the following description and drawings.

DESCRIPTION OF THE DRAWINGS

Some embodiments of the present disclosure are now described, by way of example only, and with reference to the accompanying drawings. The same reference number represents the same element or the same type of element on all drawings.

DESCRIPTION

The figures and the following description illustrate specific exemplary embodiments of the disclosure. It will thus be appreciated that those skilled in the art will be able to devise various arrangements that, although not explicitly described or shown herein, embody the principles of the disclosure and are included within the scope of the disclosure. Furthermore, any examples described herein are intended to aid in understanding the principles of the disclosure, and are to be construed as being without limitation to such specifically recited examples and conditions. As a result, the disclosure is not limited to the specific embodiments or examples described below, but by the claims and their equivalents.

Figure 1:
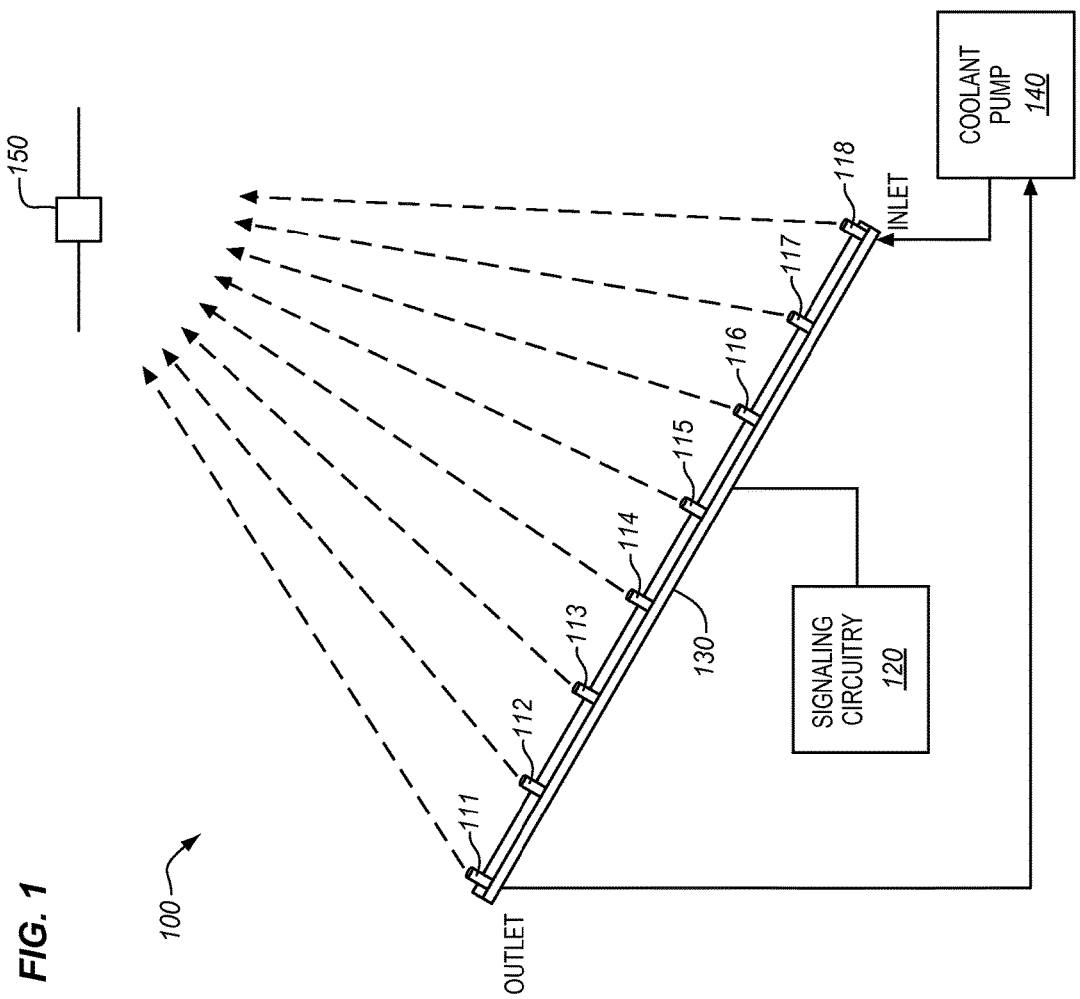
FIG. 1 is a diagram of a PAA in an exemplary embodiment.

FIG. 1 is a block diagram of a PAA 100 in an exemplary embodiment. PAA 100 comprises any system, device, or component operable to adjust the phase (e.g., by adjusting timing) of Radio Frequency (RF) signals for multiple individual array elements (e.g., antennas and associated circuitry) in order to enhance the quality of summation of the signals. PAA 100 may be utilized to receive or transmit RF signals as desired, for example, in order to exchange communications with a distant satellite 150.

In this embodiment, PAA 100 comprises multiple array elements 111-118, as well as signaling circuitry 120. Although only eight array elements are shown in this embodiment, a person of ordinary skill in the art will appreciate that an operating PAA may include thousands, or even hundreds of thousands, of individual array elements. Depending on the alignment of PAA 100 with respect to satellite 150, array elements 111-118 may each be a different distance from a receiver/transmitter/transceiver at satellite 150. Hence, signaling circuitry 120 may control the timing/phase of signals sent to (or received from) each of array elements 111-118 in order to ensure that the array elements generate one coherent RF signal for reception at satellite 150 (or to ensure that the array elements receive one coherent RF signal from satellite 150).

Array elements 111-118 comprise any suitable devices for transmitting RF signals and/or receiving incoming RF transmissions. As used herein, the term "RF signals" or "RF signaling" refers to signals that are being transmitted over the air, and to signals that are formatted for transmission over the air (e.g., via a carrier). For example, purely digital data does not qualify as an RF signal because it is not an analog waveform generated for transmission via an array element. This does not mean that digitally stored information cannot be transmitted via PAA 100, but rather means that, according to the terminology used in this application, digital data is re-formatted into an analog waveform in order to become an "RF signal."

Signaling circuitry 120 comprises any system, component, or device operable to control timing/phase shifts in RF signals at the array elements of PAA 100 in order to coherently receive or transmit RF signals along a specific direction. For example, signaling circuitry 120 may phase shift RF signals from the array elements of PAA 100 in order to perform beam-forming.

In this embodiment, coolant is pumped through a coldplate 130 across the array elements to cool PAA 100 during operation. A coolant pump 140 operates to drive coolant through the coldplate from an inlet to an outlet. However, in further embodiments, PAA 100 may utilize solely passive cooling technology (e.g., by relying on convective heat transfer) as desired.

Figure 2:
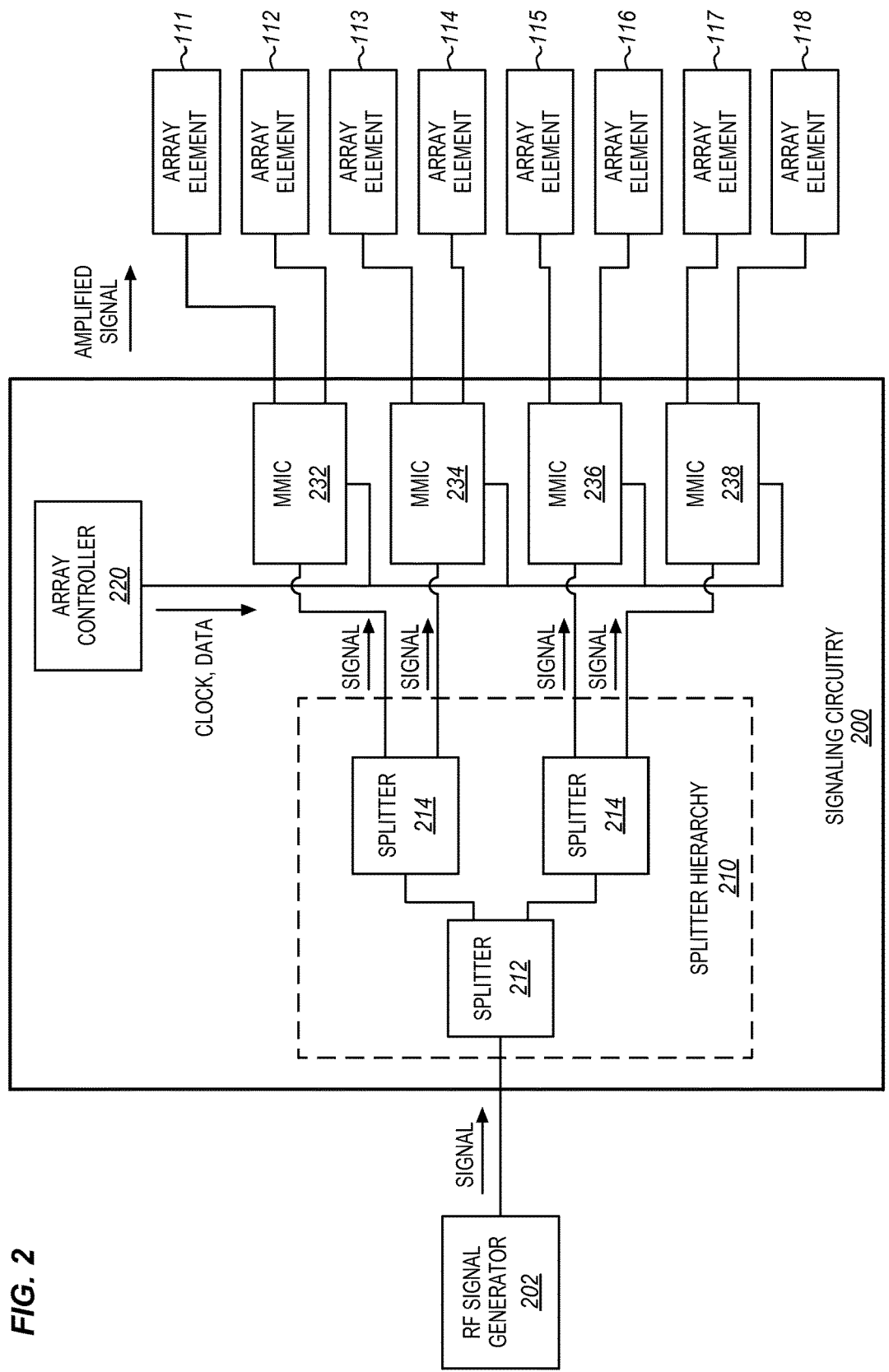
FIG. 2 is a block diagram of signaling circuitry for a PAA in an exemplary embodiment.

Further details of PAA 100 are described with respect to signaling circuitry 200 of FIG. 2. FIG. 2 illustrates exemplary circuitry capable of phase-shifting RF signals for transmission via PAA 100. However, similar techniques of phase shifting and amplification may be performed to upon RF signals received via PAA 100. In this embodiment, signaling circuitry 200 comprises splitter hierarchy 210, array controller 220, and Monolithic Microwave Integrated Circuits (MMICs) 232, 234, 236, and 238. Splitter hierarchy 210 receives RF signals from RF signal generator 202 (e.g., waveform generating circuitry) for transmission, and utilizes splitters 212, 214, and 216 to split the RF signals across MMICs 232, 234, 236, and 238. The MMICs apply phase shifts to the received RF signals. These phase shifted signals may also be amplified by the MMICs and provided to array elements 111-118 for transmission to a distant target.

Array controller 220 controls the operations of individual MMICs, such as the amount of phase shift applied by each MMIC, the amount of gain provided by amplifying RF signals at each MMIC, etc. Array controller 220 also dynamically adjusts the amount of current applied to amplifiers of the MMICs (i.e., bias current) in order to ensure that the amplifiers do not receive so much power that they overheat. In one embodiment, array controller 220 is operable to direct the operations of the MMICs in amplifying RF signals for transmission by the array elements. In another embodiment, array controller 220 is operable to direct the operations of the MMICs in amplifying RF signals received by the array elements. Array controller 220 may be implemented as custom circuitry, as a processor executing programmed instructions, or some combination thereof.

Figure 3:
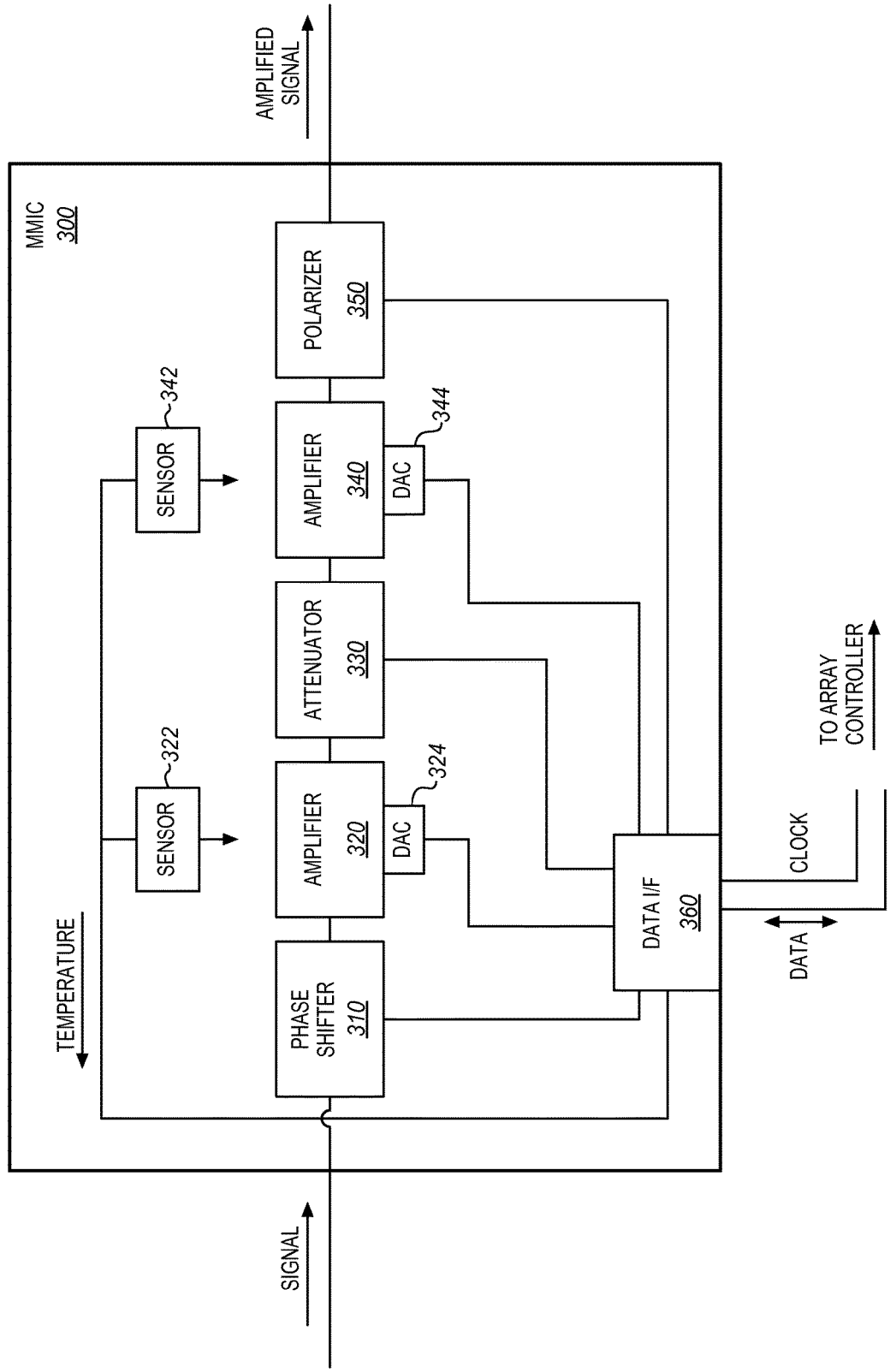
FIG. 3 is a block diagram of a Monolithic Microwave Integrated Circuit (MMIC) for a PAA in an exemplary embodiment

FIG. 3 illustrates an exemplary MMIC 300 that controls phase shifting for RF signals in an exemplary embodiment. MMIC 300 may be implemented, for example, as a Silicon Germanium (SiGe) semiconductor device. According to FIG. 3, MMIC 300 includes phase shifter 310, which alters the phase of outgoing (or incoming) RF signals. MMIC 300 also includes amplifier 320 for amplifying the phase shifted signal, attenuator 330 for attenuating the phase-shifted signal, amplifier 340 for amplifying the attenuated, phase-shifted signal, and polarizer 350 for polarizing the resultant signal. MMIC 300 further includes sensors 322 and 342. Sensor 322 measures the temperature of amplifier 320, which it is proximate to, and sensor 342 measures the temperature of amplifier 340. The number of sensors described herein is merely exemplary, and any suitable number of temperature sensors may be utilized (e.g., one per amplifier, one per MMIC, one per array element, etc.). Digital to Analog Converters (DACs) 324 and 344 regulate the amount of current applied to amplifiers 320 and 340. In a further embodiment, MMIC 300 may include multiple sets of phase shifters and amplifiers, where each set corresponds with a different array element.

The various components of MMIC 300 may receive input via data interface (I/F) 360, and may also be controlled via data I/F 360. For example, data I/F 360 may be used to control the DACs of MMIC 300, to store temperatures measured by sensors 322 and 342 (e.g., in an on-chip flash memory), and/or to perform other functions as desired. In one embodiment, data I/F 360 comprises a serial or parallel communication channel such as a computer bus interface, including a clock line and a data line, both of which may be accessed by array controller 220. In such an embodiment, the data line may include information for programming the gain and phase shift provided by MMIC 300, and may also be used by an array controller to retrieve temperature data and other parameters.

Illustrative details of the operation of PAA 100 will be discussed with regard to FIG. 4. Assume, for this embodiment, that PAA 100 has generated RF signals directed to a distant target location via array elements 111-118. The RF signals are ready for phase shifting, amplification, and transmission to a target location. MMICs at PAA 100 actively operate to apply phase shifts to RF signals in order to ensure that the RF signals are transmitted from the various array elements as a coherent beam.

Figure 4:
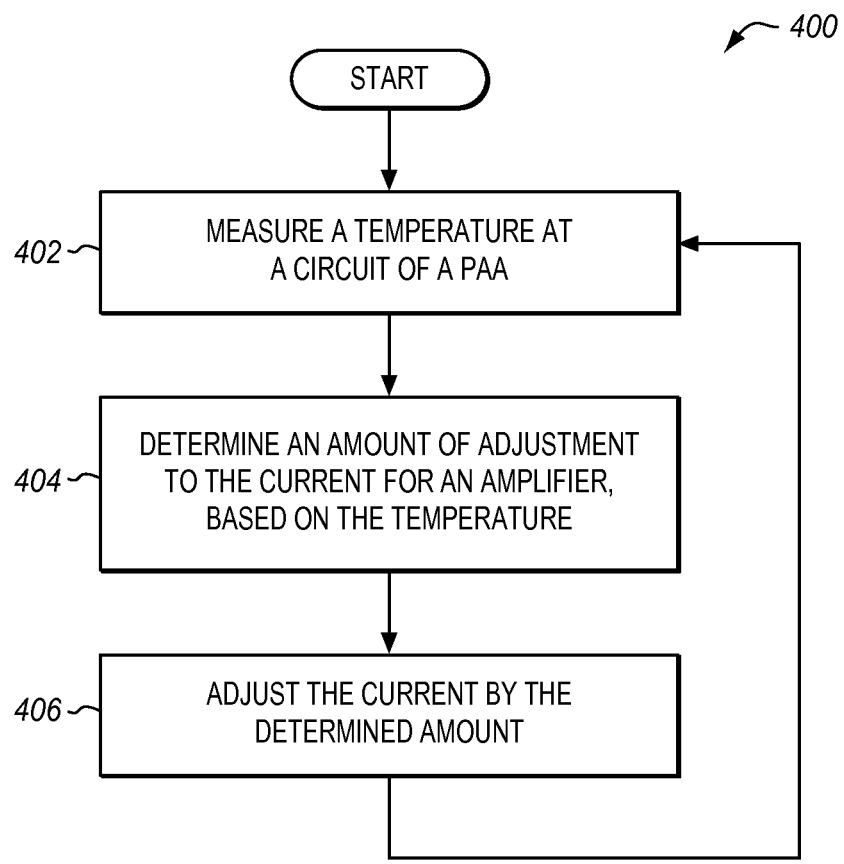
FIGS. 4-5 are flowcharts illustrating methods for operating a PAA in an exemplary embodiment.

FIG. 4 is a flowchart illustrating a method 400 for operating a PAA in an exemplary embodiment. The steps of method 400 are described with reference to PAA 100 of FIG. 1, but those skilled in the art will appreciate that method 400 may be performed in other systems, for example to control the operations of a PAA that receives RF signals. The steps of the flowcharts described herein are not all inclusive and may include other steps not shown. The steps described herein may also be performed in an alternative order.

While the MMICs operate to amplify RF signals for PAA 100, they generate heat which increases the temperature of internal amplifiers of the MMICs. To diagnose this issue, array controller 220 operates sensors 322 and 342 within MMIC 300 to measure the temperatures of the amplifiers of MMIC 300 (step 402). Data from sensors 322 and 342 is retrieved and stored in memory (e.g., registers) at data I/F 360. Array controller 220 may periodically measure temperatures via the sensors to determine whether or not the amplifiers are approaching an overheat condition.

In one embodiment, array controller 220 may measure temperatures at periodic intervals (e.g., every minute, every thirty seconds), and may further measure temperatures for individual amplifiers, groups of amplifiers, individual MMICs, groups of MMICs, or all MMICs at once. Array controller 220 may measure the temperatures of MMICs and amplifiers at different intervals depending on present operating conditions. For example, in an aircraft utilizing PAA 100, array controller 220 may measure temperatures more often while on the ground than while in the air (i.e., because the ambient temperature will be lower while flying, making overheating less likely to occur). The temperatures may be read discontinuously (e.g., by reading one set of sensors at one point in time, and another set of sensors at another point in time), and the intervals used to measure the different temperatures may vary. For example, temperatures for array elements that are located on the periphery of the PAA are more likely to experience greater cooling, and hence may be measured less often than for array elements located near the center of the PAA. In one embodiment, temperatures for an amplifier may be measured more often if the amplifier is within a predefined number of degrees of a threshold temperature indicating an overheat condition.

The temperature of the amplifier is a function of the ambient temperature, the influx of heat resulting from current actively being applied to the amplifier to operate the amplifier, and any radiative energy input (e.g., from the sun). Hence, reducing the current applied to an overheating amplifier reduces the temperature profile of the amplifier while operating. In this regard, if the temperature of amplifier 320 is approaching an overheat condition, then array controller 220 determines an amount of adjustment to the current applied to amplifier 320 based on the temperature (step 404), and adjusts the current applied to amplifier 320 (or all of MIMIC 300) by the amount (step 406). For example, array controller 220 may operate data I/F 360 in order to update a memory (e.g., a set of registers) at data I/F 360. The updated changes to data I/F 360 may in turn regulate programmable DAC 324, adjusting the amount of current for amplifier 320. These techniques of method 400 may be utilized in both receiving environments where PAA 100 receives incoming RF signals over the air, and in transmitting environments where PAA 100 actively transmits RF signals over the air. Using method 400, since overheating issues may be addressed for PAAs, a PAA may be operated in a wider range of ambient temperatures, and the operational lifetime of a PAA may also be extended.

Ambient temperature may also have a secondary effect on MMIC temperature in a PAA. Many PAAs are cooled via a liquid cooled coldplate. This enables heat to be conducted (e.g., via a circuit board) to the coldplate, wherein coolant enters the coldplate at an inlet and flows through the coldplate to an outlet for recirculation. In these embodiments, if some MMICs are "throttled back" with reduced current, other MMICs that are downstream will benefit because the coolant will be slightly cooler. Conversely, if downstream MMICs are "throttled back," the upstream modules will not receive cooler coolant, and might operate at a higher temperature than their peers, even when running on the same level of current. This upstream/downstream effect may be reduced in coldplate designs that utilize a radial coolant flow (e.g., multiple circular flow paths, or one "whirlpool" flow path), coldplate designs where flow from an inlet at the center proceeds to one or more outlets at the perimeter, or in coldplate designs that utilize multidirectional flow along a path (e.g., tube running flow in opposite directions along the same flow path). In one embodiment where flow from the coldplate proceeds from left to right, then the coolant will be less effective for MMICs located on the right, as the coolant has increased in temperature before reaching them. Hence, current may be reduced to the MMICs in order from right to left in a tapered manner. Further operations may be performed in order to account for any performance issues that may result from such a tapered power scheme. For example, MMICs on the right may use higher temperature thresholds in order to ensure proper performance, despite the degraded overall lifetime.

When the assembly is cooled via a liquid coldplate, the ambient temperature will also affect the inlet coolant temperature for the coldplate, which itself directly impacts the operating temperature of circuitry in the PAA. In contrast, heat entering the PAA via convection from the surroundings will be carried away by the coldplate and so does not typically affect the MMIC temperature substantially. The array will operate at a higher temperature in a hot ambient environment, but not by a one-for-one increase in temperature as compared to a cooler ambient environment. For example a PAA may run about 2° C. warmer when the ambient temperature changes from 40° C. to 71° C. with a constant inlet coolant temperature. Solar loading can also be significant in a PAA, because the modules are usually pointing to the sky.

Method 400 may be performed periodically or continuously, and the steps of method 400 may be performed asynchronously and/or in parallel as desired. Utilizing method 400, the amount of current applied to an amplifier of a PAA may be adjusted dynamically based on temperatures measured at the MMIC where the amplifier is located. This allows for temperature to be controlled in real-time by PAA 100, and further allows for temperature to be controlled on a granular, amplifier-by-amplifier or MMIC-by-MMIC level. Furthermore, while reducing the current applied to the amplifiers does decrease the overall gain of PAA 100, it does not substantially decrease gain unless the current is dramatically reduced (e.g., by about 75%).

Figure 5:
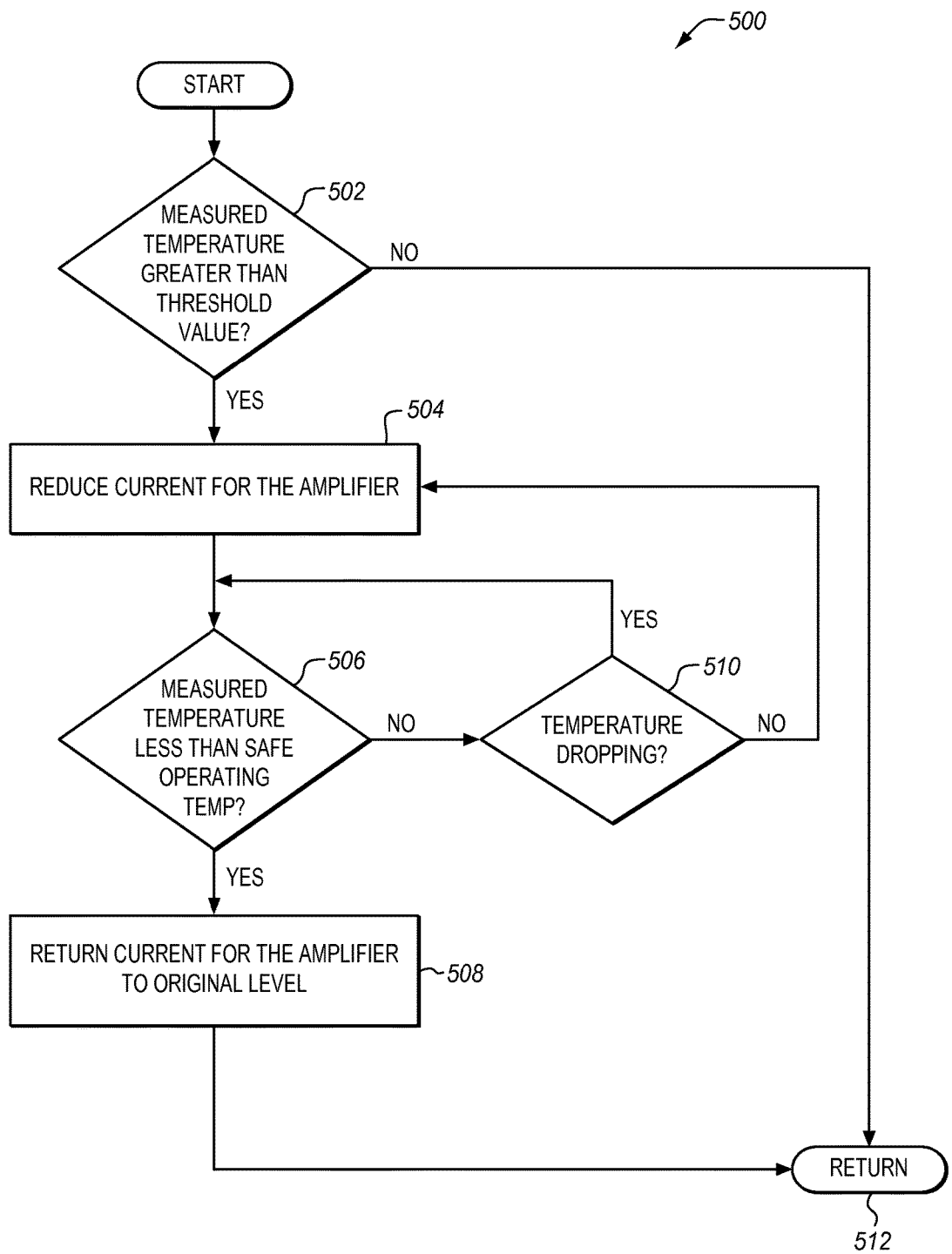

FIG. 5 is a flowchart illustrating a further method 500 for operating a PAA in an exemplary embodiment. Method 500 may, for example, be utilized as an implementation of steps 404-406 of method 400. According to method 500, array controller 220 determines whether the temperature measured at a MMIC is greater than a predefined threshold value for temperature (e.g., two hundred degrees Fahrenheit (F)), as defined in a memory of array controller 220 or within data I/F 360 (step 502). If the temperature is greater than the threshold value, then the corresponding amplifier is overheating, and array controller 220 proceeds to step 504. Alternatively, if the temperature is not higher than the threshold value, then processing may return (step 512) to step 402 of method 400.

In step 504, array controller 220 reduces the current for the amplifier which is overheating. The amount by which the current is reduced may be a function of the difference between the temperature that was measured and the threshold value. In one embodiment, array controller 220 subtracts the threshold value from the measured temperature (e.g., in ° F. or ° C.), multiplies the result by a factor (e.g., one hundred), and reduces the current by a percentage equal to the resulting amount (e.g., up to a maximum amount of fifty percent). In short, array controller 220 may scale the amount of reduction to the current applied to an amplifier based on a difference between the threshold value and the temperature measured at the MMIC.

Processing may then continue to step 506, where array controller 220 waits for a period of time after reducing the current (e.g., thirty seconds), and re-measures the temperature at the location that was previously overheating. If the new temperature is not above a safe operating temperature (e.g., a value less than the threshold value), then array controller 220 may return the current for the amplifier back to its original level (step 508). Alternatively, if the new temperature is still above the safe operating temperature, then array controller 220 may compare the current temperature to the previous temperature (step 510). If the temperature is not dropping, then array controller 220 may reduce the current still further (step 504). Alternatively, if the temperature is dropping towards the safe operating temperature, then array controller 220 may continue to wait and then re-measure the temperature (step 506), expecting the temperature to drop to the safe operating temperature (e.g., a value that is substantially lower than the threshold value).

In a further embodiment, multiple threshold values of temperature are utilized, and temperature ranges between the thresholds are each associated with a different reduction in current. For example, normal operating current may be provided below a first threshold value (e.g., a safe operating temperature of 85° C.), 75% of normal operating current may be provided below a second threshold value (e.g., 105° C.), and 50% of normal operating current may be provided above the third threshold value (e.g., 125° C.).

Figure 6:
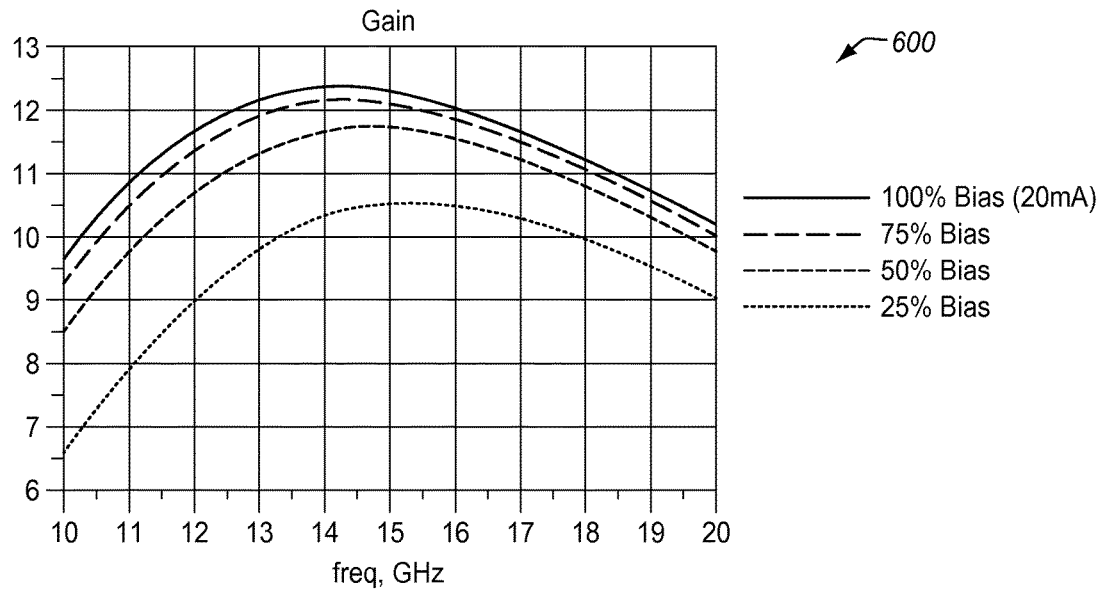
FIGS. 6-8 are charts illustrating various changes found at a PAA in response to reducing a current for amplifiers of the PAA in an exemplary embodiment.
Figure 7:
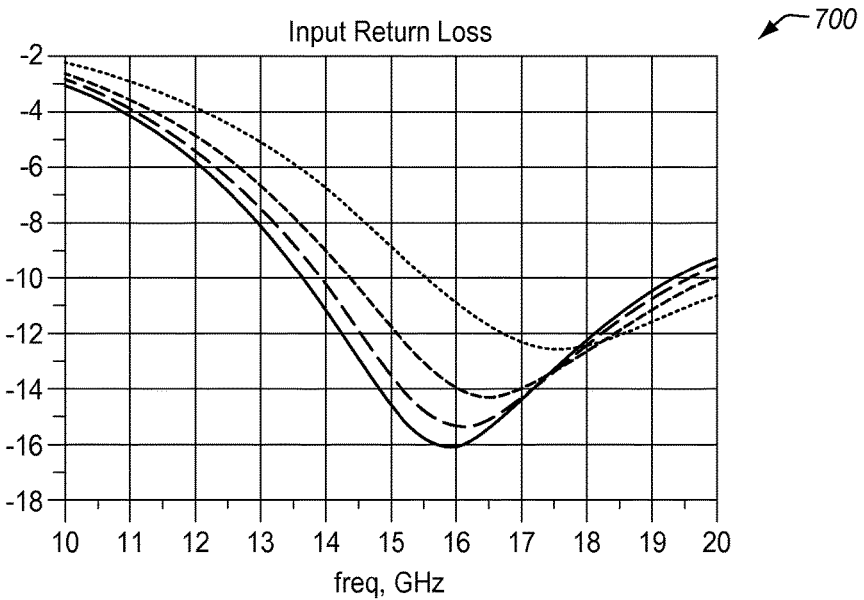
Figure 8:
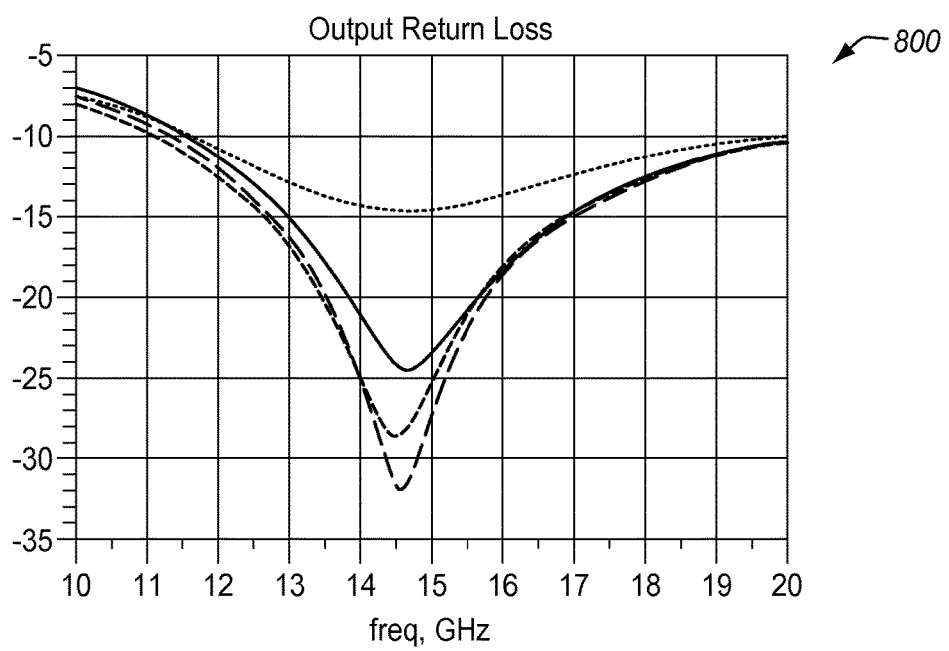

FIGS. 6-8 are charts illustrating various changes found at a PAA in response to reducing a current for amplifiers of the PAA in an exemplary embodiment. Specifically, chart 600 of FIG. 6 illustrates the gain of an amplifier when the current applied to each MMIC amplifier in the PAA is uniformly reduced from a normal operating level. The gain is roughly 12.5 decibels (dB) at full current. When the current is dropped by 50% (reducing power consumption and therefore heat generation by 50%), the small signal (e.g., low power signal) gain of the PAA still remains high at roughly 11.75 dB.

This thermal management technique allows for an optimization of the communication bandwidth versus temperature. For a PAA transmitter, reducing the bias reduces the radiated power which in turn reduces the Effective Isotropic Radiated Power (EIRP) of the PAA. This enables the PAA to continue to operate without damaging itself, even though the reduction may affect the communication bandwidth of the system. For a PAA receiver, reducing the amplifier bias reduces the PAA's ability to process large signals (e.g., high power signals). This could potentially be problematic for PAA systems that have requirements to operate through large signal RF interferers (e.g., such as the interfering level of signaling found at an airport), since a reduction in bias current reduces the size of the maximum signal that the PAA can operate through. Hence, in a further embodiment, certain elements of the PAA may be turned completely off to reduce heat generation while others remain operating at full bias current (or nearly full bias current). In such a scenario, the gain of the PAA may be reduced by the reduced number of operating elements, but the ability of the PAA to handle and/or avoid saturation (e.g., by large signal RF interferers) may remain.

Chart 700 of FIG. 7 illustrates the input return loss of an amplifier when the current applied to each MMIC amplifier in the PAA is uniformly reduced from a normal operating level. According to chart 700, the input return loss at 50% of current remains substantially close (e.g., within about 25%) to the input return loss at 100% of current. Chart 800 of FIG. 8 illustrates the output return loss of an amplifier when the current applied to each MMIC amplifier in the PAA is uniformly reduced from a normal operating level. According to chart 800, the output return loss at 50% of current remains substantially close to the output return loss at 100% of current.

EXAMPLES

In the following examples, additional processes, systems, and methods are described in the context of a PAA that operates to receive RF signals over the air. The PAA includes thousands of array elements, and each array element is proximate to a corresponding MMIC.

According to this example, an aircraft with a PAA flies high above the desert where the air temperature is cold (e.g., −40° F.). This ambient, cool air temperature allows for radiative cooling of the array elements of the PAA. Furthermore, because the aircraft is flying through the air, convective cooling also helps to reduce the temperature of the array elements of the PAA. Thus, even though an internal temperature is measured by a sensor at each MMIC of the PAA, the PAA does not encounter any operating temperatures that are higher than a threshold value of 200° F. The aircraft continues to fly for several hours, and then lands at an airstrip in the desert. On the ground, the ambient temperature is 130° F. The PAA continues to operate by providing full current to each of its several hundred MMICs, which are arranged in a grid pattern.

MMICs located near the periphery of the PAA are exposed to more convective cooling from the wind, and also may radiate more heat into their surroundings. In contrast, MMICs located near the center of the PAA are incapable of cooling as efficiently as MMICs near the border of the PAA. Because of this, the MMICs near the center of the PAA start to overheat. Each MMIC in the PAA includes a temperature sensor (in this case, a bipolar junction) next to an amplifier of the MMIC. Input from the temperature sensor of the MMIC is stored within a set of registers at the MMIC accessible via a computer bus. An array controller, implemented as a processor and memory, periodically checks the temperatures of each MMIC via the computer bus at a rate of once per second to determine whether the temperatures are deviating from an expected safe operating temperature of 85° C. A data structure at the array controller correlates each temperature with a corresponding amplifier of a MMIC. Whenever the array controller detects a temperature that exceeds a threshold value of 125° C. (which may be user-defined, or set on a per-amplifier, per-MMIC, or regional basis) then the array controller identifies the amplifier(s) that have exceeded the temperature, and directs a DAC for the amplifier to reduce the amount of current supplied to the amplifier by 25%. In this manner, the amount of heat generated by the amplifier is reduced, which in turn reduces the operating temperature of the amplifier. The array controller continues to monitor the overheating amplifier until the temperature of the amplifier drops below the threshold value, and further drops below a safe operating temperature that is less than the threshold value, at which point the array controller directs a DAC for the amplifier to return the current to its original operating level.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments are described herein, the scope of the disclosure is not limited to those specific embodiments. The scope of the disclosure is defined by the following claims and any equivalents thereof.

The invention claimed is:

1. A system comprising:
a Phased Array Antenna (PAA) comprising:
a plurality of array elements that handle Radio Frequency (RF) signals; and
a circuit comprising:
an amplifier that consumes a bias current to amplify RF signals for the PAA; and
a sensor that measures temperature at the circuit; and
an array controller that adjusts the bias current for the amplifier based on a temperature measured by the sensor.

2. The system of claim 1, wherein:
the array controller identifies a threshold value, and reduces the bias current for the amplifier in response to detecting that the temperature measured by the sensor exceeds the threshold value.

3. The system of claim 2, wherein:
the array controller scales the amount of reduction to the bias current based on a difference between the threshold value and the temperature measured by the sensor.

4. The system of claim 1, wherein:
the array controller adjusts the bias current for the amplifier by directing a programmable Digital to Analog Converter (DAC) at the circuit to alter the bias current.

5. The system of claim 1, wherein:
the PAA transmits the RF signals via the array elements, in response to receiving amplified signals via the circuits.

6. The system of claim 1, wherein:
the PAA receives the RF signals via the array elements, and the circuits amplify the received RF signals.

7. The system of claim 1, wherein:
each circuit comprises a Monolithic Microwave Integrated Circuit (MMIC).

8. A method comprising:
measuring a temperature at a circuit of a Phased Array Antenna (PAA), wherein the circuit includes an amplifier configured to consume bias current to amplify Radio Frequency (RF) signals for the PAA;
determining an amount of adjustment to the bias current for the amplifier, based on the temperature; and
adjusting the bias current for the amplifier by the determined amount.

9. The method of claim 8, further comprising:
identifying a threshold value; and
reducing the bias current for the amplifier in response to detecting that the temperature measured at the circuit exceeds the threshold value.

10. The method of claim 9, further comprising:
scaling the amount of reduction to the bias current based on a difference between the threshold value and the temperature measured at the circuit.

11. The method of claim 8, further comprising:
adjusting the current for the amplifier by directing a programmable Digital to Analog Converter (DAC) at the circuit to alter the bias current.

12. The method of claim 8, further comprising:
transmitting RF signals via array elements of the PAA, in response to receiving amplified signals via the circuit.

13. The method of claim 8, further comprising:
receiving RF signals via array elements of the PAA; and operating the circuit to amplify the received RF signals.

14. The method of claim 8, wherein:
the circuit comprises a Monolithic Microwave Integrated Circuit (MMIC).

15. A system comprising:
a Monolithic Microwave Integrated Circuit (MMIC) for a Phased Array Antenna (PAA), the MMIC comprising:
an amplifier that consumes current to amplify Radio Frequency (RF) signals for an array element of the PAA;
a sensor that measures temperatures proximate to the amplifier; and
a programmable Digital to Analog Converter (DAC) that adjusts an amount of current for the amplifier in response to input, wherein the input is based on a temperature measured by the sensor, and an amount of reduction to the current is scaled based on a difference between a threshold value and the temperature measured by the sensor.

16. The system of claim 15, wherein:
the current is a bias current.

17. The system of claim 15, wherein:
the MMIC further comprises a data interface that includes registers that store information for controlling the DAC.

18. The system of claim 15, wherein:
the MMIC further comprises multiple amplifiers, and multiple sensors that are each proximate to a different amplifier.

19. The system of claim 18, wherein:
the MMIC further comprises multiple DACs each adjust an amount of current for a different amplifier.

20. The system of claim 15, wherein:
the MMIC further comprises multiple amplifiers, a phase shifter, an attenuator, and a polarizer that each modify the RF signals.

* * * * *